(12) United States Patent
Yamaguchi et al.

(10) Patent No.: US 11,257,697 B2
(45) Date of Patent: Feb. 22, 2022

(54) TEMPERATURE MONITORING APPARATUS, HEAT TREATMENT APPARATUS, AND TEMPERATURE MONITORING METHOD

(71) Applicant: Tokyo Electron Limited, Tokyo (JP)

(72) Inventors: Tatsuya Yamaguchi, Iwate (JP); Yasuaki Kikuchi, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 370 days.

(21) Appl. No.: 16/396,994

(22) Filed: Apr. 29, 2019

(65) Prior Publication Data

US 2019/0341284 A1 Nov. 7, 2019

(30) Foreign Application Priority Data

May 1, 2018 (JP) .............................. JP2018-088379

(51) Int. Cl.
| | |
|---|---|
| *H01L 21/67* | (2006.01) |
| *G01K 7/42* | (2006.01) |
| *G01K 1/14* | (2021.01) |
| *G01K 1/02* | (2021.01) |
| *G01D 1/18* | (2006.01) |

(52) U.S. Cl.
CPC ......... *H01L 21/67248* (2013.01); *G01D 1/18* (2013.01); *G01K 1/026* (2013.01); *G01K 1/14* (2013.01); *G01K 7/42* (2013.01); *H01L 21/67098* (2013.01); *H01L 21/67109* (2013.01)

(58) Field of Classification Search
CPC ......... H01L 21/67248; H01L 21/67109; H01L 21/67098; G01K 1/026; G01K 1/14; G01K 7/42; G01D 1/18
See application file for complete search history.

(56) References Cited

U.S. PATENT DOCUMENTS

| | | | | |
|---|---|---|---|---|
| 3,825,778 | A * | 7/1974 | Ahmed .............. | G05D 23/2034 307/117 |
| 4,416,552 | A * | 11/1983 | Hessemer, Jr ....... | A61B 5/7282 374/117 |
| 4,835,980 | A * | 6/1989 | Oyanagi ............ | G05D 23/1931 62/212 |
| 6,200,021 | B1 * | 3/2001 | Mitsutani ................ | F01P 11/16 374/1 |

(Continued)

FOREIGN PATENT DOCUMENTS

| | | |
|---|---|---|
| JP | 2000-019219 A | 1/2000 |
| JP | 2012-209517 A | 10/2012 |
| WO | 2005/010970 A | 2/2005 |

*Primary Examiner* — Nathaniel T Woodward
*Assistant Examiner* — Philip L Cotey
(74) *Attorney, Agent, or Firm* — Abelman, Frayne & Schwab

(57) ABSTRACT

A temperature monitoring apparatus includes: a calculator configured to calculate a temperature monitoring waveform by a first-order lag function based on an elapsed time from a start of a temperature change from a first temperature to a second temperature, and a time constant calculated based on a locus of the temperature change; and a monitor configured to monitor a temperature changing from the first temperature to the second temperature based on the temperature monitoring waveform calculated by the calculator.

8 Claims, 3 Drawing Sheets

(56) References Cited

U.S. PATENT DOCUMENTS

| | | | | |
|---|---|---|---|---|
| 6,259,061 B1* | 7/2001 | Osawa | ............... | H01L 21/67109 |
| | | | | 118/724 |
| 7,033,071 B2* | 4/2006 | Otsuka | ................... | G01D 3/022 |
| | | | | 374/142 |
| 7,346,273 B2* | 3/2008 | Tanaka | ............... | H01L 21/67109 |
| | | | | 392/418 |
| 9,209,057 B2* | 12/2015 | Yoshii | ................ | H01L 21/67781 |
| 2009/0296384 A1* | 12/2009 | Van De Ven | ........... | H05B 45/22 |
| | | | | 362/231 |
| 2012/0251966 A1* | 10/2012 | Yoshii | ............... | H01L 21/67109 |
| | | | | 432/49 |
| 2013/0037534 A1* | 2/2013 | Yoshii | ............... | H01L 21/67781 |
| | | | | 219/494 |
| 2015/0206776 A1* | 7/2015 | Mimura | ............. | G05D 23/1919 |
| | | | | 62/3.7 |

\* cited by examiner

TEMPERATURE MONITORING APPARATUS, HEAT TREATMENT APPARATUS, AND TEMPERATURE MONITORING METHOD

CROSS-REFERENCE TO RELATED APPLICATION

This application is based on and claims priority from Japanese Patent Application No. 2018-088379, filed on May 1, 2018 with the Japan Patent Office, the disclosure of which is incorporated herein in its entirety by reference.

TECHNICAL FIELD

The present disclosure relates to a temperature monitoring apparatus, a heat treatment apparatus, and a temperature monitoring method.

BACKGROUND

A technique has been known in which a first-order lag filter is applied to a detection signal from a temperature sensor that detects the temperature in a processing container so as to estimate the temperature of a processing target, and a heating unit is controlled based on the estimated temperature of the processing target (see, e.g., Japanese Patent Laid-Open Publication No. 2012-209517).

There is also known a technique of calculating the predicted temperature of a substrate by a first-order delay calculation by mixing the temperatures detected by an internal thermocouple and an external thermocouple (see, e.g., International Publication Pamphlet No. WO 2005/010970).

SUMMARY

A temperature monitoring apparatus according to an embodiment of the present disclosure includes: a calculator configured to calculate a temperature monitoring waveform by a first-order lag function based on an elapsed time from a start of a temperature change from a first temperature to a second temperature, and a time constant calculated based on a locus of the temperature change; and a monitor configured to monitor a temperature changing from the first temperature to the second temperature based on the temperature monitoring waveform calculated by the calculator.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
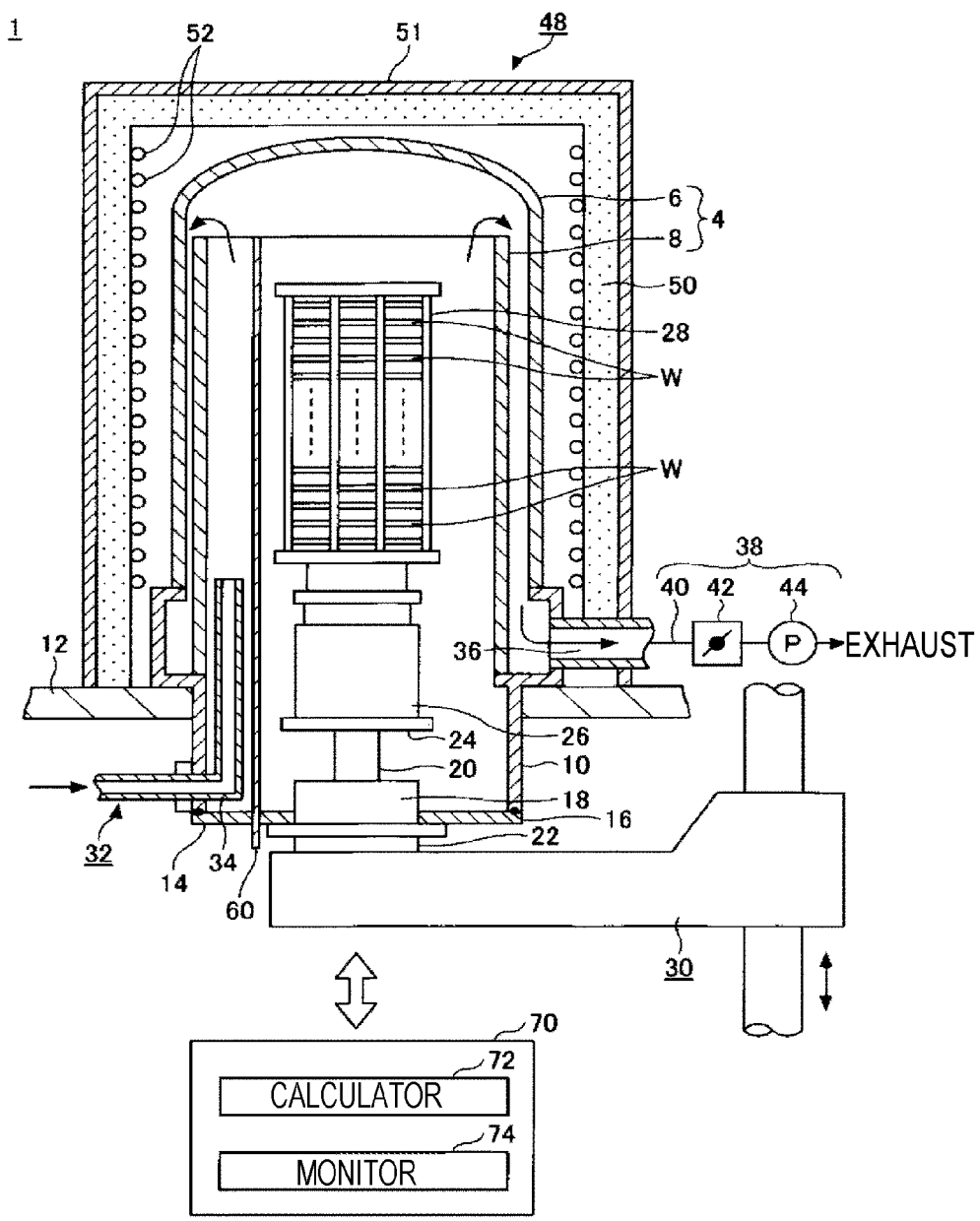
FIG. 1 is a cross-sectional view illustrating a configuration example of a heat treatment apparatus provided with a temperature monitoring apparatus.

In the following detailed description, reference is made to the accompanying drawings, which form a part thereof. The illustrative exemplary embodiments described in the detailed description, drawings, and claims are not meant to be limiting. Other exemplary embodiments may be utilized, and other changes may be made without departing from the spirit or scope of the subject matter presented here.

Hereinafter, exemplary embodiments of the present disclosure will be described with reference to the accompanying drawings. In the accompanying drawings, the same or corresponding members or parts are denoted by the same or corresponding reference numerals, and redundant explanations thereof are omitted.

The temperature monitoring apparatus according to an embodiment of the present disclosure monitors a temperature which changes from a first temperature to a second temperature, and is applicable to various apparatuses that involve temperature changes. Hereinafter, as an example, descriptions will be made on a case where a temperature monitoring apparatus is applied to the heat treatment apparatus which is an example of a semiconductor manufacturing apparatus. FIG. 1 is a cross-sectional view illustrating a configuration example of a heat treatment apparatus provided with the temperature monitoring apparatus.

As illustrated in FIG. 1, a heat treatment apparatus 1 includes an elongated processing container 4 whose longitudinal direction is vertical. The processing container 4 has a double-tube structure that includes an outer cylinder 6 having a ceiling, and a cylindrical inner cylinder 8 concentrically disposed inside the outer cylinder 6.

The outer cylinder 6 and the inner cylinder 8 are formed of a heat resistant material such as quartz. The lower ends of the outer cylinder 6 and the inner cylinder 8 are held by, for example, a stainless steel manifold 10. The manifold 10 is fixed to a base plate 12. Meanwhile, the entire processing container 4 may be formed of, for example, quartz without the manifold 10 being provided.

A disc-like cap portion 14 formed of, for example, stainless steel is attached to an opening at the lower end of the manifold 10 so as to be hermetically sealed via a seal member 16 such as an O-ring. A rotary shaft 20 which may be rotated in an airtight manner by, for example, a magnetic fluid seal 18 is inserted through a substantially central portion of the cap portion 14. A lower end of the rotating shaft 20 is connected to a rotating mechanism 22, and an upper end thereof is fixed to a table 24 formed of, for example, stainless steel.

A heat insulating cylinder 26 made of, for example, quartz is provided on the table 24. A wafer boat 28 made of, for example, quartz is placed on the heat insulating cylinder 26.

A large number (e.g., 50 to 150) of semiconductor wafers (hereinafter, referred to as "wafers W") are accommodated in the wafer boat 28 at a predetermined interval (e.g., a pitch of about 10 mm). The wafer boat 28, the heat insulating cylinder 26, the table 24, and the cap portion 14 are integrally loaded into/unloaded from the processing container 4 by an elevating mechanism 30 that serves as, for example, a boat elevator.

A gas introducing unit 32 is provided at the lower portion of the manifold 10 to introduce a processing gas into the processing container 4. The gas introducing unit 32 includes a gas nozzle 34 that is provided to penetrate the manifold 10 in an airtight manner. Meanwhile, although FIG. 1 illustrates a case where one gas introducing unit 32 is provided, a plurality of gas introducing units 32 may be provided according to the number of gas types to be used. The flow rate of the gas introduced into the processing container 4 from the gas nozzle 34 is controlled by a flow rate control mechanism (not illustrated).

A gas outlet 36 is provided at the upper portion of the manifold 10. An exhaust system 38 is connected to the gas outlet 36. The exhaust system 38 includes an exhaust passage 40 connected to the gas outlet 36, and a pressure control valve 42 and a vacuum pump 44 interposed in the middle of the exhaust passage 40. The exhaust system 38 may exhaust gas while adjusting the pressure in the processing container 4.

A heater device 48 that heats the wafers W is provided on the outer peripheral side of the processing container 4 so as to surround the processing container 4. The heater device 48 includes a heat insulating layer 50 having a ceiling that is formed in a cylindrical shape. The heat insulating layer 50 is formed of, for example, a mixture of soft amorphous silica and alumina, which has a low thermal conductivity. The thickness of the heat insulating layer 50 is usually about 30 mm to 40 mm. Further, the inner surface of the heat insulating layer 50 is spaced apart from the outer surface of the processing container 4 by a predetermined distance. In addition, a protective cover 51 formed of, for example, stainless steel is attached to the outer peripheral surface of the heat insulating layer 50 so as to cover the entire heat insulating layer 50.

Heater elements 52 are spirally wound and disposed on the inner peripheral side of the heat insulating layer 50. The heater elements 52 are wound around, for example, the entire side surface of the heat insulating layer 50, and are configured to cover the entire height direction of the processing container 4. That is, the heat insulating layer 50 is configured to be provided on the outer peripheral side of the heater elements.

Further, a thermocouple 60 is configured to be inserted inside the inner cylinder 8 so that the temperature in the inner cylinder 8 (i.e., the temperature of the wafer W) may be detected.

The heater elements 52 and the thermocouple 60 are divided into one or more zones in the height direction (FIG. 1 illustrates an example in which these elements are not divided into zones for the sake of convenience), and the temperature may be controlled independently in each zone. Meanwhile, when the heater elements 52 and the thermocouple 60 are configured to be divided into a plurality of zones in the height direction, a single controller 70 may be configured to perform a temperature control, and a controller corresponding to each zone may be prepared to perform a temperature control. In the case of a configuration in which a plurality of controllers (corresponding to the number of zones) corresponding to each zone are prepared, each of the controllers may be configured to execute a control method of a heat treatment apparatus (to be described later).

The controller 70 controls the entire operation of the apparatus. The controller 70 includes a central processing unit (CPU), a read only memory (ROM), and a random access memory (RAM). The CPU executes a desired heat treatment in accordance with a recipe stored in a storage area such as a RAM. Control information of the apparatus with respect to process conditions is set in the recipe. The control information may be, for example, a gas flow rate, a pressure, a temperature, and a processing time. The recipe and the program used by the controller 70 may be stored in, for example, a hard disk or a semiconductor memory. Further, the recipe and the like may be configured to be set at a predetermined position and read while being accommodated in a portable computer-readable storage medium such as a CD-ROM or a DVD. Meanwhile, the controller 70 may be provided separately from the heat treatment apparatus 1.

The controller 70 includes a calculator 72 and a monitor 74, and functions as a temperature monitoring apparatus.

The calculator 72 calculates a temperature monitoring waveform by a first-order lag function based on an elapsed time from a start of a temperature change from a first temperature to a second temperature, and a time constant calculated based on a locus of the temperature change. The second temperature may be different from the first temperature, may be higher than the first temperature, or may be lower than the first temperature.

Figure 2:
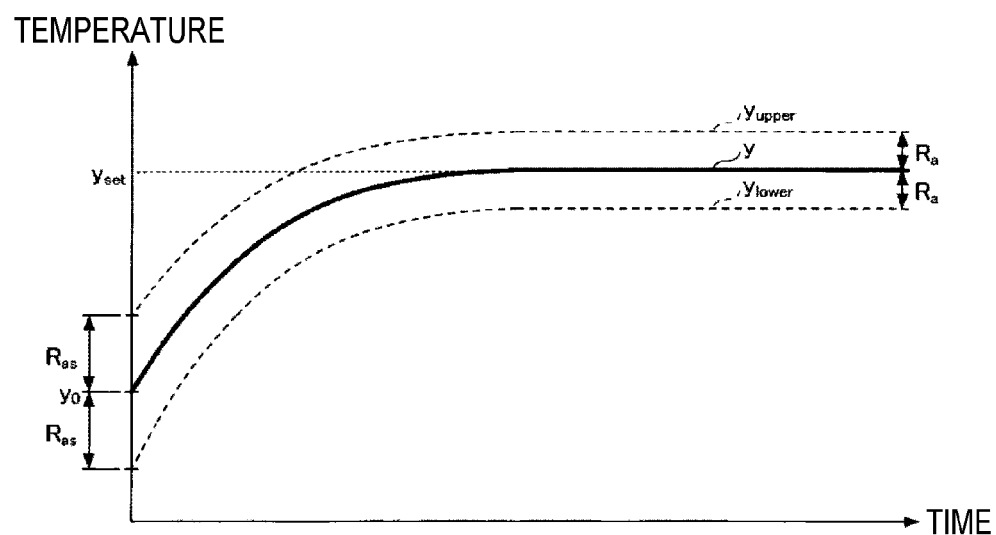
FIG. 2 is a view for explaining a method of calculating a temperature monitoring waveform.

FIG. 2 is a view for explaining a method of calculating the temperature monitoring waveform. FIG. 2 illustrates a temperature change when the wafer W at a first temperature $y_0$ is raised to a second temperature $y_{set}$ by the heater device 48. In FIG. 2, the time is illustrated on the horizontal axis, and the temperature is illustrated on the vertical axis.

As illustrated in FIG. 2, when the temperature of the wafer W is raised from the first temperature $y_0$ to the second temperature $y_{set}$ by the heater device 48, the locus of the temperature change, which is a relationship between the time t and the temperature y, is calculated by the following equation (1).

$$y = y_0 + (y_{set} - y_0) \times \left(1 - e^{-\frac{t}{T}}\right) \qquad (1)$$

(wherein $y_0$ represents a first temperature, $y_{set}$ represents a second temperature, and T represents a time constant)

In an embodiment, among the temperature monitoring waveforms calculated by the calculator 72, a waveform which defines the monitoring upper limit temperature is represented by the following equation (2).

$$y_{upper} = (y_0 + R_{as}) + ((y_{set} + R_a) - (y_0 + R_{as})) \times \left(1 - e^{-\frac{t}{T_u}}\right) \qquad (2)$$

(wherein $y_{upper}$ represents a monitoring upper limit temperature, $y_0$ represents a first temperature, $y_{set}$ represents a second temperature, $R_{as}$ represents a determination temperature range at start, $R_a$ represents a determination temperature range at stability, and $T_u$ represents a time constant)

Further, among the temperature monitoring waveforms calculated by the calculator 72, a waveform which defines the monitoring lower limit temperature is represented by the following equation (3).

$$y_{lower} = (y_0 - R_{as}) + ((y_{set} - R_a) - (y_0 - R_{as})) \times \left(1 - e^{-\frac{t}{T_l}}\right) \qquad (3)$$

(wherein $y_{lower}$ represents a monitoring lower limit temperature, $y_0$ represents a first temperature, $y_{set}$ represents a second temperature, $R_{as}$ represents a determination temperature range at start, $R_a$ represents a determination temperature range at stability, and $T_1$ represents a time constant)

Meanwhile, the first temperature $y_0$ may be, for example, a temperature at the start of a specific step of a predetermined heat treatment (e.g., a film forming step). In addition, the second temperature $y_{set}$ may be, for example, a set temperature of the above-described step (target temperature). Further, the determination temperature range at the start $R_{as}$ may be, for example, an alarm determination temperature range at the start of the above-described step. Further, the determination temperature range at the time of stability $R_a$ may be, for example, an alarm determination temperature range when the temperature is stabilized at the set temperature of the above-described step. Further, the time constant $T_u$ and the time constant $T_1$ may be determined according to the time constant T in the locus of the temperature change expressed by the equation (1), and may be values which are the same as or different from, for example, the time constant T. Further, the temperature monitoring based on the temperature monitoring waveform calculated by the calculator 72 may be performed, for example, in the entire period of the above-described steps, or limited to a partial period of the above-described steps. The partial period may be, for example, a period during which the temperature is raised from the first temperature to the second temperature, in other words, a period until the temperature is stabilized.

The monitor 74 monitors the temperature which changes from the first temperature to the second temperature based on the temperature monitoring waveform calculated by the calculator 72.

In an embodiment, the monitor 74 monitors whether the temperature detected by the thermocouple 60 is above the monitoring upper limit temperature, based on the waveform defining the monitoring upper limit temperature expressed by the equation (2) and the temperature detected by the thermocouple 60. In addition, the monitor 74 monitors whether the temperature detected by the thermocouple 60 is below the monitoring lower limit temperature, based on the waveform defining the monitoring lower limit temperature expressed by the equation (3) and the temperature detected by the thermocouple 60. When it is determined that the temperature detected by the thermocouple 60 is above the monitoring upper limit temperature or below the monitoring lower limit temperature, the monitor 74 outputs, for example, an alarm signal and displays the alarm signal on a display unit (not illustrated). An alarm may also be issued.

According to an embodiment of the present disclosure, the controller 70 calculates a temperature monitoring waveform by a first-order lag function based on an elapsed time from the start of the temperature change from the first temperature to the second temperature, and the time constant calculated based on the locus of the temperature change. Then, the controller 70 monitors the temperature that changes from the first temperature to the second temperature based on the calculated temperature monitoring waveform. As a result, it is possible to monitor the temperature which represents a transient response. Therefore, an alarm monitoring may be performed even when the temperature change is involved in one step, such as a step of forming a film on the wafer W while changing the temperature.

Next, with respect to the temperature monitoring waveform, descriptions will be made on, as an example, a case where an approximation may be made to the locus of the temperature change from the first temperature to the second temperature by the first-order lag function expressed by the equation (1) in which the first temperature $y_0$ is 467° C., the second temperature $y_{set}$ is 530° C., and the time constant T is 500 seconds.

Figure 3:
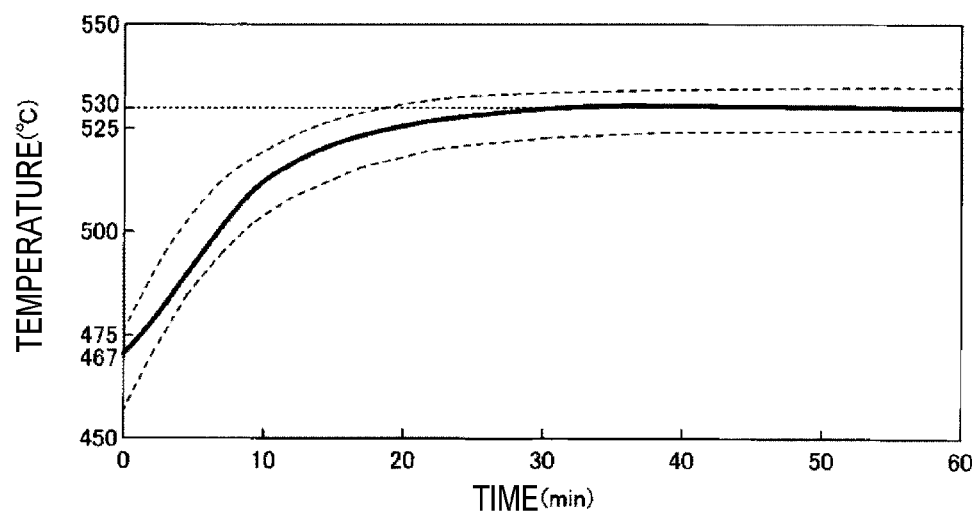
FIG. 3 is a view illustrating an example of a temperature monitoring waveform of a temperature which represents a transient response.

First, in the above-described equations (2) and (3), descriptions will be made on the temperature monitoring waveform when the determination temperature range at the start $R_{as}$ is 10° C., the determination temperature range at the stability $R_a$ is 5° C., the time constant $T_u$ is 430 seconds, and the time constant $T_1$ is 500 seconds. FIG. 3 is a view illustrating an example of the temperature monitoring waveform of a temperature which represents a transient response. In FIG. 3, the time (min) is illustrated on the horizontal axis, and the temperature (° C.) is illustrated on the vertical axis. In FIG. 3, the locus of the temperature change from the first temperature to the second temperature is indicated by a solid line, and the temperature monitoring waveform is indicated by a broken line.

As illustrated in FIG. 3, it can be seen that the temperature monitoring waveform corresponding to the locus of the temperature change is formed in the period during which the temperature of the wafer W is changing from the first temperature (467° C.) to the second temperature (530° C.), and the period during which the temperature of the wafer W is stabilized at the second temperature (530° C.). As a result, it is possible to monitor the temperature which represents a transient response.

Figure 4:
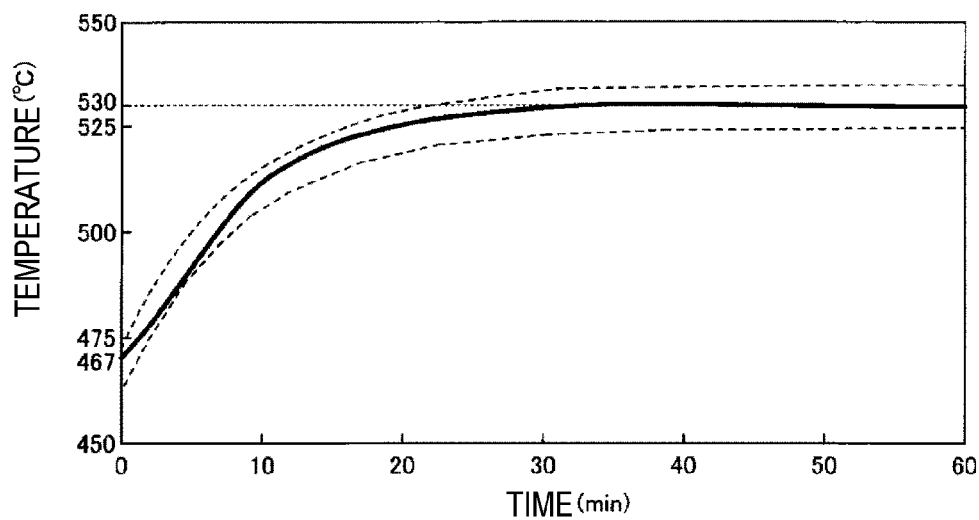
FIG. 4 is a view illustrating another example of a temperature monitoring waveform of a temperature which represents a transient response.

Further, in the above-described equations (2) and (3), descriptions will be made on the temperature monitoring waveform when the determination temperature range at the start $R_{as}$ is 5° C., the determination temperature range at the stability $R_a$ is 5° C., the time constant $T_u$ is 500 seconds, and the time constant $T_1$ is 500 seconds. FIG. 4 is a view illustrating another example of the temperature monitoring waveform of a temperature which represents a transient response. In FIG. 4, the time (min) is illustrated on the horizontal axis, and the temperature (° C.) is illustrated on the vertical axis. In FIG. 4, the locus of the temperature change from the first temperature to the second temperature is indicated by a solid line, and the temperature monitoring waveform is indicated by a broken line.

As illustrated in FIG. 4, it can be seen that the temperature monitoring waveform corresponding to the locus of the temperature change is formed in the period during which the temperature of the wafer W is changing from the first temperature (467° C.) to the second temperature (530° C.), and the period during which the temperature of the wafer W is stabilized at the second temperature (530° C.). As a result, it is possible to monitor the temperature which represents a transient response. In the example illustrated in FIG. 4, it is possible to monitor the temperature during the temperature increase from the first temperature to the second temperature with a narrower monitoring range than in the example illustrated in FIG. 3. However, when the monitoring range during the temperature increase from the first temperature to the second temperature is narrow, false monitoring results may be output due to a slight noise during the temperature increase, so the determination temperature range at the start $R_{as}$ may be greater than the determination temperature range at the time of the stability $R_a$.

Figure 5:
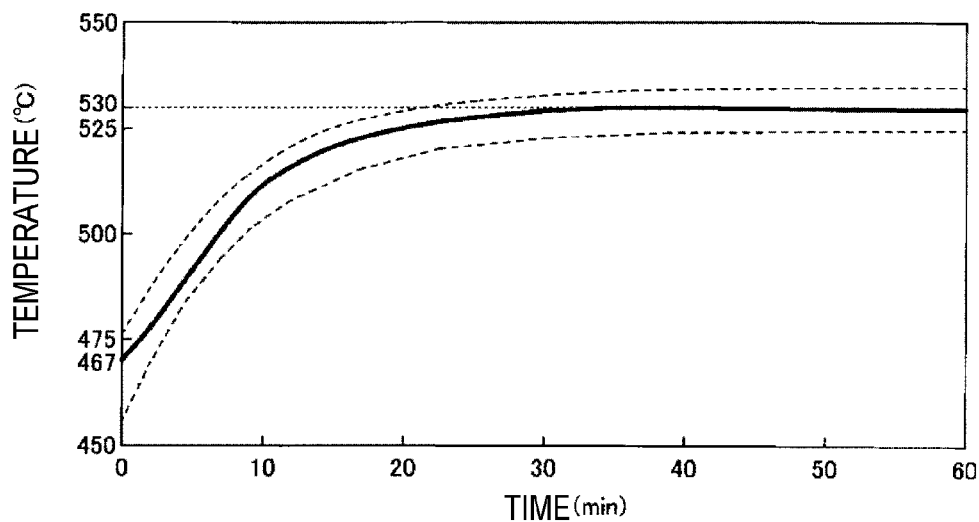
FIG. 5 is a view illustrating yet another example of a temperature monitoring waveform of a temperature which represents a transient response.

In the above-described equations (2) and (3), descriptions will be made on the temperature monitoring waveform when the determination temperature range at the start $R_{as}$ is 10° C., the determination temperature range at the stability $R_a$ is 5° C., the time constant $T_u$ is 500 seconds, and the time constant $T_1$ is 500 seconds. FIG. 5 is a view illustrating another example of the temperature monitoring waveform of a temperature which represents a transient response. In FIG. 5, the time (min) is illustrated on the horizontal axis, and the temperature (° C.) is illustrated on the vertical axis. In FIG. 5, the locus of the temperature change from the first temperature to the second temperature is indicated by a solid line, and the temperature monitoring waveform is indicated by a broken line.

As illustrated in FIG. 5, it can be seen that the temperature monitoring waveform corresponding to the locus of the temperature change is formed in the period during which the temperature of the wafer W is changing from the first temperature (467° C.) to the second temperature (530° C.), and the period during which the temperature of the wafer W is stabilized at the second temperature (530° C.). As a result, it is possible to monitor the temperature which represents a transient response. In the example illustrated in FIG. 5, it is possible to monitor the temperature during the temperature increase from the first temperature to the second temperature with a broader monitoring range than in the example illustrated in FIG. 4. As a result, it is possible to suppress the output of false monitoring results due to a slight noise during the temperature increase as compared to the example illustrated in FIG. 4.

As described above, it is possible to easily adjust the shape of the temperature monitoring waveform by changing the determination temperature range at the start $R_{as}$, the determination temperature range at the stability $R_a$, the time constant $T_u$, the time constant $T_l$, and the like.

In the above-described embodiment, the heater device 48 is an example of a heating unit, and the thermocouple 60 is an example of a temperature detection unit.

In the above-described embodiment, descriptions have been made on, as an example, a case where the temperature monitoring waveform is either a waveform that defines the monitoring upper limit temperature or a waveform that defines the monitoring lower limit temperature. However, the present disclosure is not limited to this. For example, the temperature monitoring waveform may have two or more waveforms that define the monitoring upper limit temperature, or may have two or more waveforms that define the monitoring lower limit temperature.

In the above-described embodiment, descriptions have been made on, as an example, a case where the processing container has a double-tube structure including an inner tube and an outer tube. However, the present disclosure is not limited to this. For example, the processing container may have a single-tube structure.

In the above-described embodiment, descriptions have been made on, as an example, a case where the processing gas is supplied into the processing container from the lower end position of the processing container. However, the present disclosure is not limited to this. For example, gas nozzles may be disposed along the longitudinal direction of the wafer boat to supply the processing gas by a side flow method.

In the above-described embodiment, as a heat treatment apparatus including a temperature monitoring apparatus, descriptions have been made on, as an example, a batch-type vertical heat treatment apparatus that processes a large number of wafers at a time. However, the present disclosure not limited to this. For example, the heat treatment apparatus may be a single-wafer processing apparatus which processes wafers one by one. In addition, the heat treatment apparatus may be, for example, a semi-batch type apparatus which forms a film on a wafer by revolving a plurality of wafers disposed on a rotating table in a processing container by a rotating table, and sequentially passing through the region to which a source gas is supplied and the region to which a reaction gas that reacts with the source gas is supplied.

In the above-described embodiment, descriptions have been made on, as an example, a case where the substrate to be processed by the heat treatment apparatus is a semiconductor wafer. However, the present disclosure is not limited to this. The substrate may be, for example, a large substrate for a flat panel display (FPD), or a substrate for an EL element or a solar cell.

As a result, it is possible to monitor the temperature which represents a transient response.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A temperature monitoring apparatus, comprising:
a calculator configured to calculate a temperature monitoring waveform by a first-order lag function based on an elapsed time from a start of a temperature change from a first temperature to a second temperature, and a time constant calculated based on a locus of the temperature change;
a temperature detector configured to detect a temperature in a processing container; and
a monitor configured to monitor a temperature changing from the first temperature to the second temperature based on the temperature monitoring waveform calculated by the calculator,
wherein the monitor is further configured to monitor (i) whether the temperature detected by the temperature detector is above a monitoring upper limit temperature, or (ii) whether the temperature detected by the temperature detector is below a monitoring lower limit temperature, based on the temperature monitoring waveform and the temperature detected by the temperature detector.

2. The temperature monitoring apparatus according to claim 1, wherein the temperature monitoring waveform is expressed by the following equation (2):

$$y_{upper} = (y_0 + R_{as}) + ((y_{set} + R_a) - (y_0 + R_{as})) \times \left(1 - e^{-\frac{t}{T_u}}\right) \quad (2)$$

(wherein $y_{upper}$ represents the monitoring upper limit temperature, $y_o$ represents a first temperature, $y_{set}$ represents a second temperature, $R_{as}$ represents a determination temperature range at start, $R_a$ represents a determination temperature range at stability, and $T_u$ represents a time constant).

3. The temperature monitoring apparatus according to claim 2, wherein the temperature monitoring waveform is expressed by the following equation (3):

$$y_{lower} = (y_0 - R_{as}) + ((y_{set} - R_a) - (y_0 - R_{as})) \times \left(1 - e^{-\frac{t}{T_l}}\right) \quad (3)$$

(wherein $y_{lower}$ represents the monitoring lower limit temperature, $y_o$ represents a first temperature, $y_{set}$ represents a second temperature, $R_{as}$ represents a determination temperature range at start, $R_a$ represents a determination temperature range at stability, and $T_1$ represents a time constant).

4. The temperature monitoring apparatus according to claim 3, wherein the determination temperature range at the start ($R_{as}$) is greater than the determination temperature range at the stability ($R_a$).

5. The temperature monitoring apparatus according to claim 1, wherein the temperature monitoring waveform is expressed by the following equation (3):

$$y_{lower} = (y_0 - R_{as}) + ((y_{set} - R_a) - (y_0 - R_{as})) \times \left(1 - e^{-\frac{t}{T_1}}\right) \quad (3)$$

(wherein $y_{lower}$ represents the monitoring lower limit temperature, $y_o$ represents a first temperature, $y_{set}$ represents a second temperature, $R_{as}$ represents a determination temperature range at start, $R_a$ represents a determination temperature range at stability, and $T_1$ represents a time constant).

6. The temperature monitoring apparatus according to claim 2, wherein the determination temperature range at the start ($R_{as}$) is greater than the determination temperature range at the stability ($R_a$).

7. A heat treatment apparatus comprising:
a processing container that accommodates a substrate;
a heater configured to heat the substrate accommodated in the processing container;
a temperature detector configured to detect a temperature in the processing container; and
a controller configured to: calculate a temperature monitoring waveform by a first-order lag function based on an elapsed time from a start of a temperature change from a first temperature to a second temperature, and a time constant calculated based on a locus of the temperature change; and monitor a temperature changing from the first temperature to the second temperature based on a calculated temperature monitoring waveform,
wherein the controller is further configured to monitor (i) whether the temperature detected by the temperature detector is above a monitoring upper limit temperature, or (ii) whether the temperature detected by the temperature detector is below a monitoring lower limit temperature, based on the temperature monitoring waveform and the temperature detected by the temperature detector.

8. A temperature monitoring method comprising:
calculating a temperature monitoring waveform by a first-order lag function based on an elapsed time from a start of a temperature change from a first temperature to a second temperature, and a time constant calculated based on a locus of the temperature change;
monitoring a temperature changing from the first temperature to the second temperature based on the calculated temperature monitoring waveform; and
determining (i) whether a temperature detected by a temperature detector is above a monitoring upper limit temperature, or (ii) whether the temperature detected by the temperature detector is below a monitoring lower limit temperature, based on the temperature monitoring waveform and the temperature detected by the temperature detector.

* * * * *